US009806237B2

(12) United States Patent
Kräuter

(10) Patent No.: US 9,806,237 B2
(45) Date of Patent: Oct. 31, 2017

(54) METHOD FOR PRODUCING A LIGHT-EMITTING DIODE

(75) Inventor: Gertrud Kräuter, Regensburg (DE)

(73) Assignee: OSRAM Opto Semiconductors GmbH (DE)

(*) Notice: Subject to any disclaimer, the term of this patent is extended or adjusted under 35 U.S.C. 154(b) by 715 days.

(21) Appl. No.: 13/265,407

(22) PCT Filed: Apr. 8, 2010

(86) PCT No.: PCT/EP2010/054663
§ 371 (c)(1),
(2), (4) Date: Dec. 7, 2011

(87) PCT Pub. No.: WO2010/136252
PCT Pub. Date: Dec. 2, 2010

(65) Prior Publication Data
US 2012/0070926 A1    Mar. 22, 2012

(30) Foreign Application Priority Data

May 26, 2009  (DE) .................. 10 2009 022 682

(51) Int. Cl.
H01L 21/00 (2006.01)
H01L 33/50 (2010.01)
(Continued)

(52) U.S. Cl.
CPC .............. *H01L 33/50* (2013.01); *C23C 4/134* (2016.01); *C23C 24/04* (2013.01); *H01L 33/22* (2013.01); *H01L 2933/0041* (2013.01)

(58) Field of Classification Search
CPC .. H01L 33/50; H01L 33/22; H01L 2933/0041
(Continued)

(56) References Cited

U.S. PATENT DOCUMENTS 6,537,121 B1 *  3/2003  Baret ................. H01J 9/261
                                                    315/169.4
8,003,998 B2 *  8/2011  Bogner ............... H01L 33/62
                                                    257/88
(Continued)

FOREIGN PATENT DOCUMENTS

CN     101228640       7/2008
DE     100 10 638      9/2001
(Continued)

OTHER PUBLICATIONS

Chinese Examination Report dated Oct. 8, 2013 and English translation.
(Continued)

*Primary Examiner* — Marc Armand
*Assistant Examiner* — Wilner Jean Baptiste
(74) *Attorney, Agent, or Firm* — DLA Piper LLP (US)

(57) ABSTRACT

A method for producing a light-emitting diode includes providing a light-emitting diode chip including a semiconductor body, and applying a luminescence conversion material to an outer area of the semiconductor body by thermal spraying such that at least part of electromagnetic radiation generated during operation of the light-emitting diode impinges on the luminescence conversion material, or providing a radiation-transmissive carrier, applying a luminescence conversion material to an outer area of the carrier by thermal spraying, and arranging the carrier at a radiation exit area of the light-emitting diode chip such that at least part of electromagnetic radiation generated during operation of the light-emitting diode impinges on the luminescence conversion material.

6 Claims, 2 Drawing Sheets

(51) Int. Cl.
*C23C 24/04* (2006.01)
*C23C 4/134* (2016.01)
*H01L 33/22* (2010.01)

(58) Field of Classification Search
USPC .......................................................... 438/29
See application file for complete search history.

(56) References Cited

U.S. PATENT DOCUMENTS

| | | | |
|---|---|---|---|
| 9,324,920 B2* | 4/2016 | Sabathil | ................. H01L 33/20 |
| 2003/0030067 A1 | 2/2003 | Chen | |
| 2006/0068676 A1 | 3/2006 | Hwang | |
| 2006/0083013 A1* | 4/2006 | Wanninger et al. | .......... 362/509 |
| 2006/0182969 A1 | 8/2006 | Kitamura et al. | |
| 2007/0164300 A1 | 7/2007 | Nabeta et al. | |
| 2008/0203410 A1* | 8/2008 | Brunner et al. | ................. 257/98 |
| 2008/0284946 A1* | 11/2008 | Abe | ................. G02F 1/133615 |
| | | | 349/68 |
| 2009/0040465 A1* | 2/2009 | Conner | ................ G02B 27/283 |
| | | | 353/20 |
| 2009/0084981 A1* | 4/2009 | Bown | .............. G06K 19/06009 |
| | | | 250/459.1 |
| 2009/0140205 A1* | 6/2009 | Kijima et al. | ......... 252/301.6 R |
| 2009/0186433 A1* | 7/2009 | Yamaguchi | ........... C03B 19/063 |
| | | | 438/26 |
| 2010/0001294 A1* | 1/2010 | Faller | ...................... F21V 29/83 |
| | | | 257/79 |
| 2010/0068410 A1* | 3/2010 | Jensen | ................... C23C 24/04 |
| | | | 427/554 |
| 2010/0084964 A1 | 4/2010 | Groetsch et al. | |
| 2011/0085336 A1* | 4/2011 | Blumel et al. | ................ 362/255 |

FOREIGN PATENT DOCUMENTS

| | | |
|---|---|---|
| DE | 10 2007 010 244 A1 | 8/2008 |
| DE | 10 2007 037 875 A1 | 2/2009 |
| DE | 10 2007 041 852 A1 | 3/2009 |
| DE | 20 2009 000 537 U1 | 4/2009 |
| JP | 2004-107727 | 4/2004 |
| JP | 2006-008793 A | 1/2006 |
| JP | 2006-210588 | 8/2006 |
| JP | 2006-303001 A * | 11/2006 |
| JP | 2006-313829 A | 11/2006 |
| JP | 2006-324407 | 11/2006 |
| JP | 2006-332502 A | 12/2006 |
| JP | 2006-339217 A * | 12/2006 |
| JP | 2008-108952 | 5/2008 |
| JP | 2008-545269 | 12/2008 |
| JP | 2009-99716 | 5/2009 |
| JP | 2009-102514 | 5/2009 |
| WO | 98/12757 A1 | 3/1998 |
| WO | 2006/082170 A1 | 8/2006 |
| WO | 2009/021859 A1 | 2/2009 |

OTHER PUBLICATIONS

Dr. St. Siegmann, "Thermal-sprayed layers: characterization and application," English Abstract, EMPA Thun, Seminar "Angewandte Oberflächenanalytik," Dübendorf CH, 1995.

Dr. Stephan Siegmann et al., "Thermal-sprayed thick-film layers for electronic applications, Production of active and passive components," English Abstract, Bulletin SEV/VSE 21/99, pp. 11-15.

"Thermal spraying—definition," English Abstract, IFKB-Institut für Fertigungstechnologie keramischer Bauteile, Universität Stuttgart, 2004, pp. 1-18.

Dr. Steffen Marx, "Cold Gas Spraying—a new quality in the coating technology," English Abstract, FNE Forschungsinstittut für Nichteisen-Metalle Freiberg GmbH, Lessingstr. 41, 09599 Freiberg.

World premiere: coating without solvents . . . with the Nanopowder Plasma Deposition PC 1, English Abstract, Beschichten ohne Lösungsmittel!, Reinhausen Plasma GmbH, Weidener Str. 20, 93057 Regensburg.

Japanese Examination Report dated Dec. 24, 2013 in corresponding Japanese Patent Application No. 2012-512271.

* cited by examiner

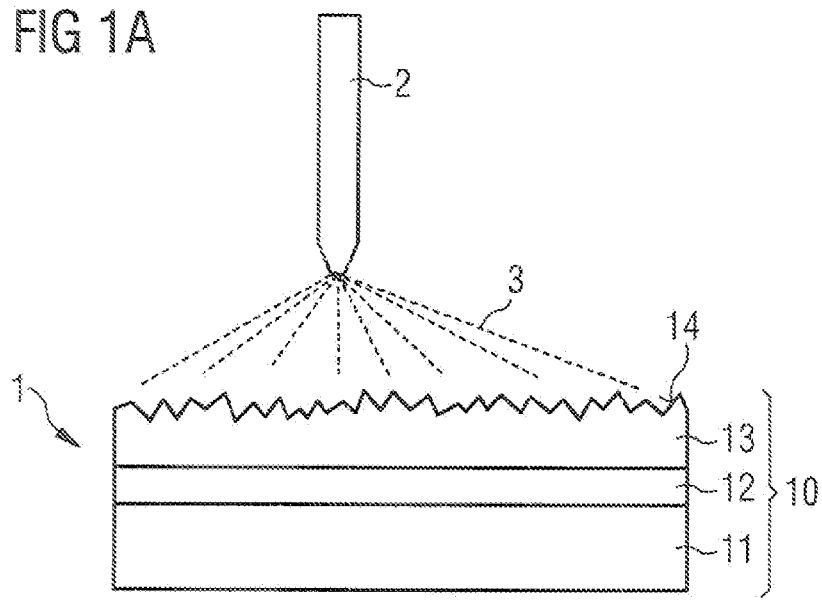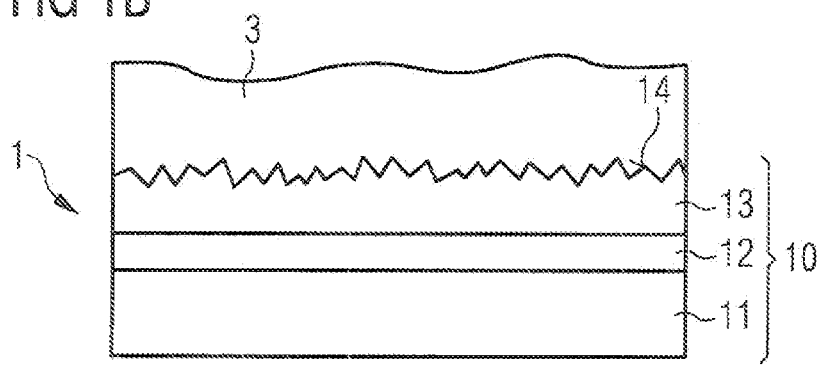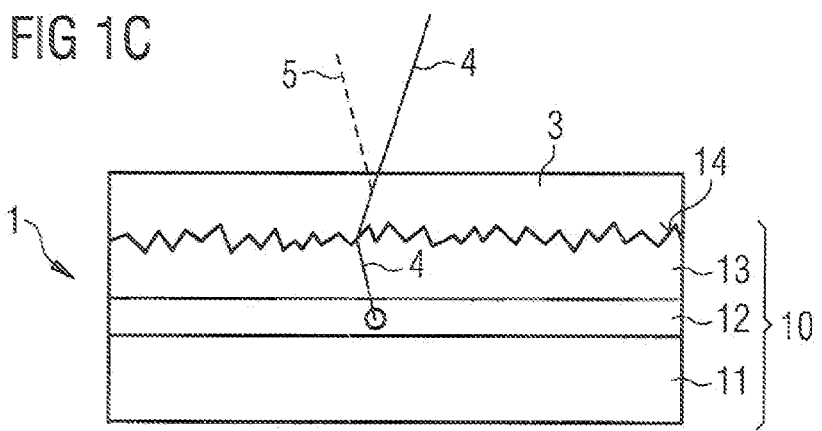

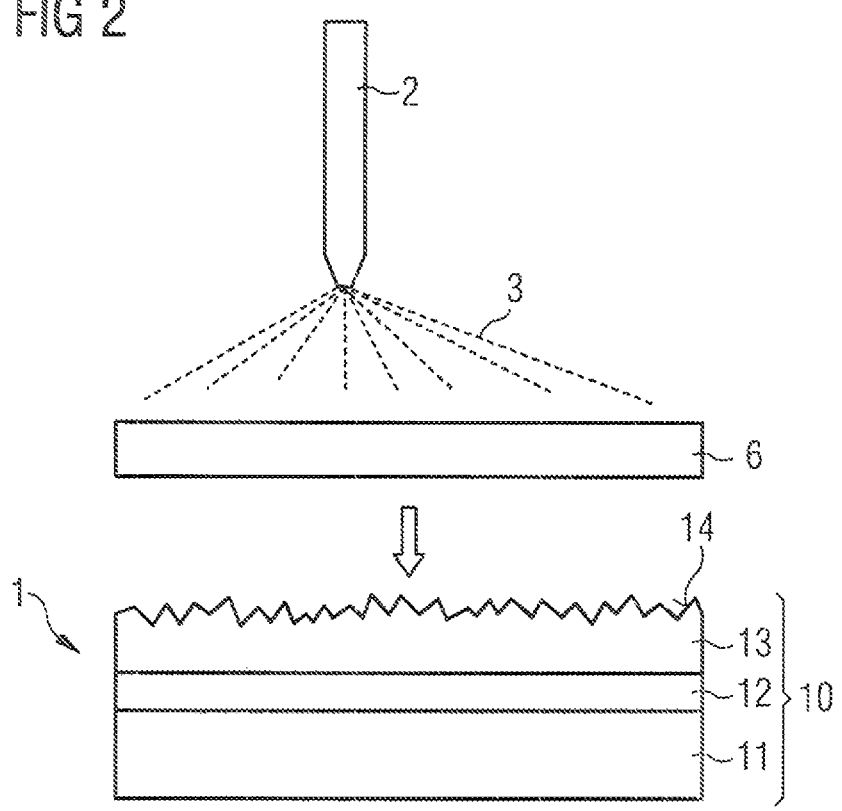

METHOD FOR PRODUCING A LIGHT-EMITTING DIODE

RELATED APPLICATIONS

This is a §371 of International Application No. PCT/EP2010/054663, with an international filing date of Apr. 8, 2010 (WO 2010/136252, published Dec. 2, 2010), which is based on German Patent Application No. 10 2009 022 682.6, filed May 26, 2009, the subject matter of which is incorporated by reference.

TECHNICAL FIELD

This disclosure relates to a method for producing a light-emitting diode.

BACKGROUND

US 2006/0182969 describes a powder suitable for coating by thermal spraying. WO 2006/082170 describes a method for cold gas spraying. DE 20 2009 000 537 describes an installation for plasma deposition. It could nonetheless be helpful to provide a method for producing a light-emitting diode which can be carried out particularly simply and in a cost-saving fashion.

SUMMARY

I provide a method for producing a light-emitting diode including providing a light-emitting diode chip including a semiconductor body, and applying a luminescence conversion material to an outer area of the semiconductor body by thermal spraying such that at least part of electromagnetic radiation generated during operation of the light-emitting diode impinges on the luminescence conversion material, or providing a radiation-transmissive carrier, applying a luminescence conversion material to an outer area of the carrier by thermal spraying, and arranging the carrier at a radiation exit area of the light-emitting diode chip such that at least part of electromagnetic radiation generated during operation of the light-emitting diode impinges on the luminescence conversion material.

I also provide a method for producing a light-emitting diode including providing a light-emitting diode chip including a semiconductor body, and applying a luminescence conversion material to an outer area of the semiconductor body by thermal spraying such that at least part of electromagnetic radiation generated during operation of the light-emitting diode impinges on the luminescence conversion material, wherein the light-emitting diode chip includes a semiconductor body including a plurality of semiconductor layers grown epitaxially and at least one active region in which electromagnetic radiation is generated during operation of the light-emitting diode chip and, after the luminescence conversion material has been applied, part of the luminescence conversion material is removed.

BRIEF DESCRIPTION OF THE DRAWINGS

FIGS. 1A, 1B, 1C and 2 show, on the basis of schematic sectional illustrations, different method steps.

DETAILED DESCRIPTION

A light-emitting diode chip is provided which may comprise a semiconductor body. The light-emitting diode chip is suitable, for example, for generating electromagnetic radiation in the wavelength range of UV radiation and/or blue light. The light-emitting diode chip comprises a semiconductor body, which can comprise semiconductor layers grown epitaxially. In particular, the semiconductor body preferably comprises at least one active region in which electromagnetic radiation is generated during operation of the light-emitting diode. The light-emitting diode can be provided individually or in a wafer assemblage. That is to say that it is also possible to provide a multiplicity of light-emitting diode chips which have not yet been singulated, but rather are present in a wafer assemblage, i.e., in a wafer with a multiplicity of light-emitting diode chips.

A luminescence conversion material may be applied to the outer area of the semiconductor body. The luminescence conversion material is a material which is suitable for absorbing electromagnetic radiation and reemitting electromagnetic radiation with a longer wavelength than the absorbed electromagnetic radiation. The luminescence conversion material is preferably applied to an outer area of the semiconductor body such that at least part of the electromagnetic radiation generated during operation of the light-emitting diode impinges on the luminescence conversion material. This can be achieved, for example, by applying the luminescence conversion material to a radiation exit area of the light-emitting diode chip. The luminescence conversion material can then cover the radiation exit area in places or completely.

In this case, the luminescence conversion material is applied by thermal spraying. Thermal spraying is a surface coating method. During thermal spraying, additional materials, the so-called "spraying additives," are melted off, melted on or melted within or outside a spray torch, accelerated into a gas flow in the form of spray particles and spun onto the surface of the body to be coated. In this case, the surface of the body to be coated is not melted and is thermally loaded only to a small extent. Layer formation of the material sprayed on takes place since the material sprayed on, for example, in the form of particles, upon impinging on the body to be coated, in a process- and material-dependent manner, is flattened to a greater or lesser extent and adheres to the body primarily by mechanical interlocking and builds up a sprayed layer in plies.

A light-emitting diode chip may be provided which comprises a semiconductor body. Afterward, a luminescence conversion material is applied to the outer area of the semiconductor body by thermal spraying such that at least part of the electromagnetic radiation generated during operation of the light-emitting diode impinges on the luminescence conversion material.

It is possible for the luminescence conversion material to come into direct contact with the semiconductor body without connecting material or matrix material. This has the advantage that heat generated during conversion of electromagnetic radiation can be dissipated well, since no, for example, organic matrix is present between the particles of the luminescence conversion material.

The luminescence conversion material is preferably a luminescence conversion material which is suitable for down-conversion. That is to say that the luminescence conversion material absorbs electromagnetic radiation and reemits electromagnetic radiation with longer wavelengths.

The luminescence conversion material, instead of being applied directly to the outer area of the semiconductor body may be applied to the outer area of a carrier by thermal spraying. The carrier is a radiation-transmissive carrier which is transmissive at least to part of the electromagnetic radiation generated in the light-emitting diode chip during operation and/or of the electromagnetic radiation converted by the luminescence conversion material. In an additional method step, the carrier is arranged at a radiation exit area of the light-emitting diode chip such that at least part of the electromagnetic radiation generated during the operation of the light emitting diode impinges on the luminescence conversion material. This can be achieved, for example, by fixing the carrier on the radiation exit area of the light-emitting diode chip or disposing it downstream of the radiation exit area in an emission direction of the light-emitting diode chip.

A light-emitting diode chip comprising a semiconductor body may be provided. Furthermore, a radiation-transmissive carrier may be provided. A luminescence conversion material is applied to the outer area of the carrier. The luminescence conversion material is applied by thermal spraying. The carrier coated with the luminescence conversion material is arranged at a radiation exit area of the light-emitting diode chip such that at least part of the electromagnetic radiation generated during operation of the light-emitting diode impinges on the luminescence conversion material.

Advantageously, the luminescence conversion material is in direct contact with the carrier and no further material, for example, a matrix material, is situated between the particles of the luminescence conversion material, such that heat generated during the conversion can be dissipated to the carrier particularly efficiently.

The carrier may be formed with one of the following materials: ceramic, semiconductor material, glass, plastic. The carrier can, for example, contain at least one of the materials mentioned or consist of one of the materials mentioned. The carrier can be embodied as a flexible film, for example, which can be applied as a lamina onto the radiation exit area of the light-emitting diode chip. The outer area of the carrier can be coated with the luminescence conversion material in places or completely.

The thermal spraying may be cold gas spraying. Cold gas spraying is a subform of thermal spraying.

During cold-gas spraying, a coating material, which is present in powder form, for example, is applied at high speed to the body to be coated. For this purpose, a process gas heated to a few hundred degrees Celsius is accelerated by expansion in a de Laval nozzle to supersonic speed and the particles of the coating material are subsequently injected into the gas jet. In this case, the injected spray particles are accelerated to such a high speed that, in contrast to other thermal spraying methods, even without preceding incipient melting or melting, upon impact on the body to be coated, they form a dense and fixedly adhering layer. The kinetic energy at the point in time of the impact of the particles of the coating material on the body does not suffice to complete melting of the particles. Cold gas spraying is a particularly gentle option for applying luminescence conversion material directly to a semiconductor body or to the outer area of a carrier.

The thermal spraying may be a nanopowder plasma deposition. This method is based on the principle of atmospheric plasma spraying. By this method it is possible to deposit particles having an average diameter in the nanometers range. In this case, the carrier or the semiconductor body do not experience heating. In this case, the average diameter of the deposited particles is between 1 nm and 10 µm, for example.

The particles of the luminescence conversion material may have an average diameter of between 1 nm and 20 µm.

The luminescence conversion material may comprise at least one inorganic phosphor. The inorganic phosphor can be, for example, one of the following phosphors: garnets doped with rare earth metals, alkaline earth metal sulfides doped with rare earth metals, thiogallates doped with rare earth metals, aluminates doped with rare earth metals, orthosilicates doped with rare earth metals, chlorosilicates doped with rare earth metals, alkaline earth metal silicon nitrides doped with rare earth metals, oxynitrides doped with rare earth metals, aluminum oxynitrides doped with rare earth metals.

The phosphors described exhibit, for example, absorption in the range of ultraviolet or blue primary radiation and have fluorescence in the visible, for example, yellow, spectral range.

The luminescence conversion material may comprise at least one organic phosphor. By way of example, the luminescence conversion material comprises at least one of the following organic phosphors: perylenes, benzopyrenes, coumarins, rhodamines, azo dye, terylene dye, quaterylene dye, naphthalimide dye, cyanine dye, xanthene dye, oxazine dye, anthracene dye, naphthacene dye, anthraquinone dye, thiazine dye.

It is possible for the luminescence conversion material to comprise only inorganic or only organic phosphors. In particular, it is also possible for the luminescence conversion material to comprise exactly one phosphor.

The luminescence conversion material may comprise at least one inorganic phosphor and an organic phosphor. In this case, the luminescence conversion material can comprise at least one of the above-mentioned organic phosphors and at least one of the above-mentioned inorganic phosphors. The combination of organic and inorganic phosphors can have the effect that the scattering effect of the inorganic phosphor leads to an increased probability of absorption in the organic phosphor. In this case, the phosphors can be selected such that both phosphors absorb electromagnetic radiation generated by the light-emitting diode chip during operation and reemit electromagnetic radiation in each case of a mutually different color. A light-emitting diode whose emitted, for example, white, light has a particularly high color rendering value is realized in this way.

In this case, different phosphors, for example, organic and inorganic phosphors, can be applied simultaneously, that is to say in a mixed fashion. Furthermore, it is possible for layers comprising different phosphors to be applied one above another. By way of example, a first layer, facing the semiconductor body or the carrier, consists of an inorganic phosphor, while a second layer, arranged on the first layer, consists of a different inorganic phosphor or an organic phosphor.

The luminescence conversion material may be removed in places after it has been applied to the semiconductor body or the carrier. The removal can be effected, for example, by grinding, polishing or by laser removal of the applied luminescence conversion material. The layer thickness and also the structuring of the layer composed of luminescence conversion material can be set by the removal. It is thereby possible that the color locus of the mixed light emitted by the light-emitting diode can be set particularly precisely.

The method described here is explained in greater detail below on the basis of examples and the associated figures.

Elements which are identical, of identical type or act identically are provided with the same reference symbols in the figures. The figures and the size relationships of the elements illustrated in the figures among one another should not be regarded as to scale. Rather, individual elements may be illustrated with an exaggerated size to enable better illustration and/or to afford a better understanding.

FIG. 1A shows, on the basis of a schematic sectional illustration, a first method step. In the method, a light-emitting diode chip 1 is provided. The light-emitting diode chip 1 comprises a semiconductor body 10. The semiconductor body 10 comprises differently doped semiconductor layers 11, 13, between which an active region 12 is arranged. The active region 12 is provided for generating electromagnetic radiation 4 (in this respect, also cf. FIG. 1C) during the operation of the light-emitting diode chip 1.

The semiconductor body 10 comprises a radiation exit area 14 which can be roughened, for example. Roughening of the radiation exit area 14 can lead to an increase in the probability of the exiting of electromagnetic radiation 4 generated in the active region 12.

Luminescence conversion material 3 is applied with a nozzle 2, for example, to the radiation passage area 14 of the semiconductor body 10 by thermal spraying, for example, by cold spraying. The luminescence conversion material 3 comprises, for example, a ceramic phosphor supplied as a powder or suspension to an energy source, for example, an arc, a plasma, or a laser, is melted, accelerated in the gas flow and is deposited onto the radiation passage area 14. The ceramic phosphor can be, for example, one of the following doped garnets: YAG:Ce, TAG:Ce, TbYAG:Ce, LuAG:Ce.

The average particle size of the phosphors is, for example, between 1 µm and 50 µm, for example, between 2 µm and 15 µm. In this case, smaller particle sizes in the range of 2 µm, for example, lead, for example, to darker light-emitting diodes which, however, are distinguished by a high color homogeneity. Larger particle sizes in the range of 15 µm, for example, lead to brighter light-emitting diodes on account of the smaller scattering effect.

It can be seen from the schematic sectional illustration in FIG. 1B that, after the conclusion of the application of the luminescence conversion material 3, a layer of the luminescence conversion material 3 has been applied to the radiation passage area 14 of the semiconductor body 10 of the light-emitting diode chip 1.

FIG. 1C illustrates the light-emitting diode chip 1 after removal of part of the layer composed of luminescence conversion material 3. By way of example, part of the luminescence conversion material 3 is removed by grinding or polishing to produce a smooth and uniform outer area of the layer comprising luminescence conversion material 3.

Electromagnetic radiation 4 generated in the active region 12 during operation passes into the luminescence conversion material 3, where it is partly converted into converted electromagnetic radiation 5. The light-emitting diode produced in this way can generate, for example, mixed light composed of directly generated electromagnetic radiation and converted electromagnetic radiation 5.

A further example of a method described here is explained in greater detail with reference to the schematic sectional illustration in FIG. 2. In this example, the luminescence conversion material 3 is applied to the outer area of a carrier 6, which is transmissive to electromagnetic radiation 4 generated in the active region 12 of the light-emitting diode chip 1. The coated carrier 6 can subsequently be fixed to the light-emitting diode chip 1 at the radiation passage area 14.

By way of example, the carrier 6 can be fixed to the light-emitting diode chip 1 with an optical adhesive by silicone or by a glass. The glass can be a glass having a low melting point or a glass from a sol-gel process. Removal of part of the layer composed of luminescence conversion material 3 is possible before or after application on the light-emitting diode chip 1.

This disclosure is not restricted to the examples by the description on the basis of the examples. Rather, the method encompasses any novel feature and also any combination of features, which in particular includes any combination of features in the appended claims, even if the feature or the combination itself is not explicitly specified in the claims or examples.

The invention claimed is:

1. A method of producing a light-emitting diode comprising:
providing a light-emitting diode chip comprising a semiconductor body,
providing a radiation-transmissive carrier formed from one selected from the group consisting of ceramic material, semiconductor material, glass and plastic,
applying a luminescence conversion material directly to an outer area of the carrier by cold gas spraying, and
arranging the carrier at a radiation exit area of the light-emitting diode chip by a glass such that at least part of electromagnetic radiation generated during operation of the light-emitting diode impinges on the luminescence conversion material, wherein the glass has a low melting point and/or is formed by a sol-gel process,
wherein the luminescence conversion material comprises at least one inorganic phosphor or at least one organic phosphor, the at least one inorganic phosphor is selected from the group consisting of garnets doped with rare earth metals, alkaline earth metal sulfides doped with rare earth metals, thiogallates doped with rare earth metals, aluminates doped with rare earth metals, orthosilicates doped with rare earth metals, chlorosilicates doped with rare earth metals, alkaline earth metal silicon nitrides doped with rare earth metals, oxynitrides doped with rare earth metals and aluminum oxynitrides doped with rare earth metals, and the at least one organic phosphor is selected from the group consisting of perylenes, benzopyrenes, coumarins, rhodamines, azo dye, terylene dye, quaterylene dye, naphthalimide dye, cyanine dye, xanthene dye, oxazine dye, anthracene dye, naphthacene dye, anthraquinone dye and thiazine dye.

2. The method according to claim 1, wherein particles of the luminescence conversion material have an average diameter of between 1 µm and 50 µm, wherein the luminescence conversion material is suitable for down-conversion of electromagnetic radiation.

3. The method according to claim 1, wherein after the luminescence conversion material has been applied, part of the luminescence conversion material is removed.

4. The method according to claim 3, wherein a layer thickness and/or a structuring of a layer composed of the luminescence conversion material is set by removing.

5. The method according to claim 3, wherein a color locus of a mixed light emitted by the light-emitting diode chip and the luminescence conversion material is set by removing.

6. The method according to claim 1, wherein the thermal spraying is a nanopowder plasma deposition method and average diameter of deposited particles of the luminescence conversion material is between 1 nm and 100 nm, wherein the luminescence conversion material is suitable for down-conversion of electromagnetic radiation.

* * * * *